(12) United States Patent
Zhang et al.

(10) Patent No.: US 11,807,008 B2
(45) Date of Patent: Nov. 7, 2023

(54) MULTIFUNCTIONAL PRINTHEAD SERVICE STATION WITH MULTI-AXIS MOTIONS

(71) Applicant: Applied Materials, Inc., Santa Clara, CA (US)

(72) Inventors: Daihua Zhang, Los Altos, CA (US); Kang Luo, Santa Clara, CA (US); Kazuya Daito, Milpitas, CA (US); Kenneth S. Ledford, San Jose, CA (US); Elsa Massonneau, Sunnyvale, CA (US); Alexey Stepanov, Sunnyvale, CA (US); Ludovic Godet, Sunnyvale, CA (US); Mahendran Chidambaram, Saratoga, CA (US); Visweswaren Sivaramakrishnan, Cupertino, CA (US); Bahubali S. Upadhye, Bangalore (IN); Hemantha Raju, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/647,780

(22) Filed: Jan. 12, 2022

(65) Prior Publication Data

US 2022/0363060 A1 Nov. 17, 2022

(30) Foreign Application Priority Data

May 11, 2021 (IN) .............................. 202141021236

(51) Int. Cl.
*B41J 2/165* (2006.01)
(52) U.S. Cl.
CPC ......... *B41J 2/1652* (2013.01); *B41J 2/16547* (2013.01)

(58) Field of Classification Search
CPC ........................... B41J 2/1652; B41J 2/16547
See application file for complete search history.

(56) References Cited

U.S. PATENT DOCUMENTS

| | | | | |
|---|---|---|---|---|
| 5,980,018 | A * | 11/1999 | Taylor | B41J 2/16547 347/31 |
| 6,588,876 | B2 * | 7/2003 | Taylor | B41J 2/16547 347/31 |
| 9,227,412 | B1 | 1/2016 | Liu et al. | |
| 2006/0181567 | A1 | 8/2006 | Tezuka | |
| 2016/0229188 | A1 | 8/2016 | Kakegawa et al. | |
| 2020/0376834 | A1 | 12/2020 | Nakano et al. | |

FOREIGN PATENT DOCUMENTS

WO 2020051056 A1 3/2020

OTHER PUBLICATIONS

European Search Report issued to Patent Application No. 22156116. 01 dated Jul. 14, 2022.

* cited by examiner

*Primary Examiner* — Sharon Polk
(74) *Attorney, Agent, or Firm* — PATTERSON & SHERIDAN, LLP

(57) ABSTRACT

Embodiments described herein relate to an inkjet service station and methods of servicing an inkjet printer with the inkjet service station. The inkjet service station is disposed in an inkjet printer of an inkjet chamber. The inkjet service station is operable to perform servicing operations on a processing apparatus of the inkjet printer. The servicing operations include at least one of printhead spitting, printhead purging, printhead flushing, printhead cleaning, printhead drying, or vacuum suction.

20 Claims, 5 Drawing Sheets

MULTIFUNCTIONAL PRINTHEAD SERVICE STATION WITH MULTI-AXIS MOTIONS

CROSS-REFERENCE TO RELATED APPLICATIONS

This application claims the benefit of Indian Provisional Patent Application No. 202141021236, filed May 11, 2021, which is herein incorporated by reference.

BACKGROUND

Field

Embodiments of the present disclosure generally relate to inkjet chambers. More specifically, embodiments described herein provide for an inkjet service station and methods of servicing an inkjet printer with the inkjet service station.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device, or handheld device, to view the surrounding environment, yet also see images of virtual objects that are generated in the display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is fabricating optical films and optical devices. Conventional approaches have attempted to use inkjet printing to address these challenges, however, it is difficult to maintain servicing performance consistency to efficiently perform the inkjet printing processes. Accordingly, what is needed in the art is an inkjet service station.

SUMMARY

In one embodiment, an inkjet service station is provided. The inkjet service station includes a first slide rail, a service stage disposed on the first slide rail, a service stage extension coupled to the service stage, and a second slide rail disposed on the service stage extension. The inkjet service station further includes a catch tray disposed on the second slide rail. The catch tray includes a vacuum knife disposed in the catch tray and a cleaning head disposed in the catch tray. The cleaning head is operable to form a liquid bubble. The catch tray further includes a leak sensor disposed in the catch tray.

In another embodiment, an inkjet chamber is provided. The inkjet chamber includes a fluid supply manifold disposed in a lower region of the inkjet chamber and an inkjet printer disposed in a processing region of the inkjet chamber. The inkjet chamber is in fluid communication with the fluid supply manifold. The inkjet printer includes a moveable stage configured to move along a pair of tracks, a processing apparatus disposed above the moveable stage, and an inkjet service station. The inkjet service station includes a first slide rail, a service stage disposed on the first slide rail, a service stage extension coupled to the service stage, a second slide rail disposed on the service stage extension, and a catch tray disposed on the second slide rail.

In yet another embodiment, a method of performing servicing operations is provided. The method includes positioning a catch tray of a printhead service station under a processing apparatus of an inkjet printer. The catch tray moves in one or both of an x direction and a y direction to be positioned under one or more printheads of the processing apparatus such that the process apparatus remains stationary. The method further includes performing one or more of the servicing operations on the processing apparatus with the catch tray. The servicing operations include one or more of printhead spitting, printhead purging, printhead flushing, printhead cleaning, printhead drying, or vacuum suction operations. The method further includes moving the catch tray in one or both of an x direction and a y direction to be positioned away from the processing apparatus.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to inkjet chambers. More specifically, embodiments described herein provide for an inkjet service station and methods of servicing an inkjet printer with the inkjet service station. The inkjet printer includes the inkjet service station. The inkjet printing platform may be utilized for fabrication of optical devices, displays, solar panel, among other applications.

In one embodiment, an inkjet chamber is provided. The inkjet chamber includes a fluid supply manifold disposed in a lower region of the inkjet chamber and an inkjet printer disposed in a processing region of the inkjet chamber. The inkjet chamber is in fluid communication with the fluid supply manifold. The inkjet printer includes a moveable stage configured to move along a pair of tracks, a processing apparatus disposed above the moveable stage, and an inkjet service station. The inkjet service station includes a first slide rail, a service stage disposed on the first slide rail, a service stage extension coupled to the service stage, a second slide rail disposed on the service stage extension, and a catch tray disposed on the second slide rail.

In another embodiment, a method of performing servicing operations is provided. The method includes positioning a catch tray of a printhead service station under a processing apparatus of an inkjet printer. The catch tray moves in one or both of an x direction and a y direction to be positioned under one or more printheads of the processing apparatus such that the process apparatus remains stationary. The method further includes performing one or more of the servicing operations on the processing apparatus with the catch tray. The servicing operations include one or more of printhead spitting, printhead purging, printhead flushing, printhead cleaning, printhead drying, or vacuum suction operations. The method further includes moving the catch tray in one or both of an x direction and a y direction to be positioned away from the processing apparatus.

Figure 1:
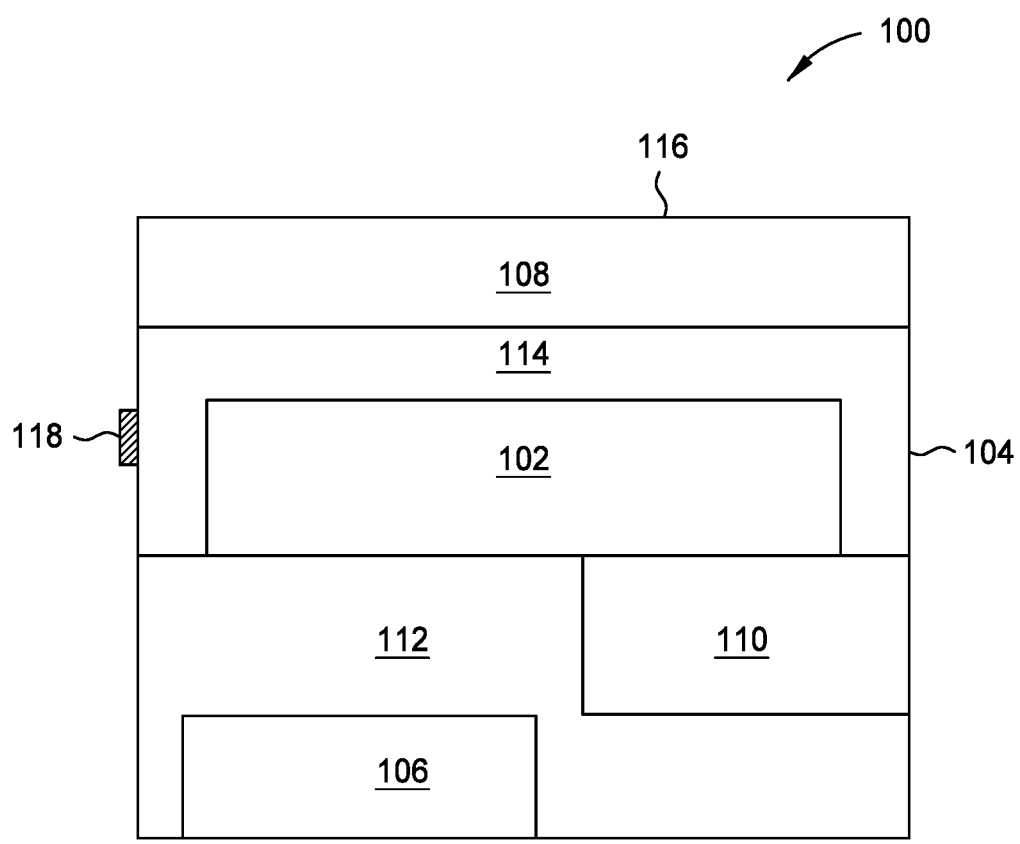
FIG. 1 is a schematic side-view of an inkjet printer according to embodiments.

FIG. 1 is a schematic, side-view of an inkjet chamber 100. The inkjet chamber 100 is operable to facilitate inkjet printing processes on a substrate 220 (shown in FIG. 2). For example, an optical device substrate may be positioned in the inkjet chamber 100. An inkjet printing process may be performed on the optical device substrate. The inkjet printing process enables selective coating of the substrate with an inkjet material to avoid contamination in sensitive areas of the substrate. The thickness of the inkjet material on the substrate 220 (shown in FIG. 2) may also be modulated with the inkjet printing process to form a thickness profile. Additionally, the inkjet printing process minimizes material usage when forming the optical films or the substrates.

The inkjet chamber 100 includes an enclosure 104. The enclosure 104 encloses an inkjet printer 102, a fluid supply manifold 106, a fan filter unit 108, and an exhaust port 110 within the inkjet chamber 100. The inkjet printer 102 and the fan filter unit 108 are disposed in a processing region 114 of the inkjet chamber. The inkjet printing process is performed with the inkjet printer 102 within the processing region 114. The exhaust port 110 and the fluid supply manifold 106 are disposed in a lower region 112 of the inkjet chamber 100. The lower region 112 is disposed below the processing region 114. The enclosure 104 includes a slit valve 118 therethrough such that a transfer robot (not shown) may position the substrate 220 (shown in FIG. 2) in the processing region 114.

In some embodiments, which can be combined with other embodiments described herein, the inkjet chamber 100 may include a heat source, such as lamps or infrared generating radiant heaters, adapted to heat the substrate 220 (shown in FIG. 2) to a desired temperature. In another embodiment, which can be combined with other embodiments described herein, the inkjet chamber 100 can further be pressurized under a vacuum condition to ensure that any undesirable water or other contamination is removed from the surface of the substrate 220 (shown in FIG. 2) prior to processing.

The fluid supply manifold 106 is disposed in the lower region 112. The fluid supply manifold 106 may include service fluids utilized for service operations of the inkjet chamber 100. The service fluids include, but are not limited to, water, such as deionized water, isopropyl alcohol, propylene glycol methyl ether acetate (PGMEA), or combinations thereof. The fluid supply manifold 106 may also include material sources, such as inkjet materials, utilized in the inkjet printing process. The inkjet materials include, but are not limited to, acrylate, oil, water, or solvent based formulations, or combinations thereof. The fluid supply manifold 106 may be fluidly coupled to the inkjet printer 102.

The exhaust port 110 is disposed in the lower region 112. The exhaust port 110 is fluidly coupled to the processing region 114. The exhaust port 110 is operable to remove contaminants from the processing region 114 produced during processing. In one embodiment, which can be combined with other embodiments described herein, contaminants such as volatile organic compounds (VOCs) generated by the inkjet material or maintenance materials are removed via the exhaust port 110. The processing region 114 is maintained at a negative pressure (e.g., vacuum) to avoid the contaminants leaking outside of the inkjet chamber 100.

The fan filter unit 108 is disposed in the processing region 114. The fan filter unit 108 is coupled to a top surface 116 of the enclosure 104. The fan filter unit 108 is operable to create a vertical flow of clean, dry air through the processing region 114. The fan filter unit 108 maintains the processing region 114 at a positive pressure to minimize air and particle intake from outside the inkjet chamber 100. The fan filter unit 108 and the exhaust port 110 provide independent pressure control in the processing region 114. The fan filter unit 108 and the exhaust port 110 provide for control of the processing region 114. The control of the processing region 114 ensures process quality and consistency when processing the substrates.

Figure 2:
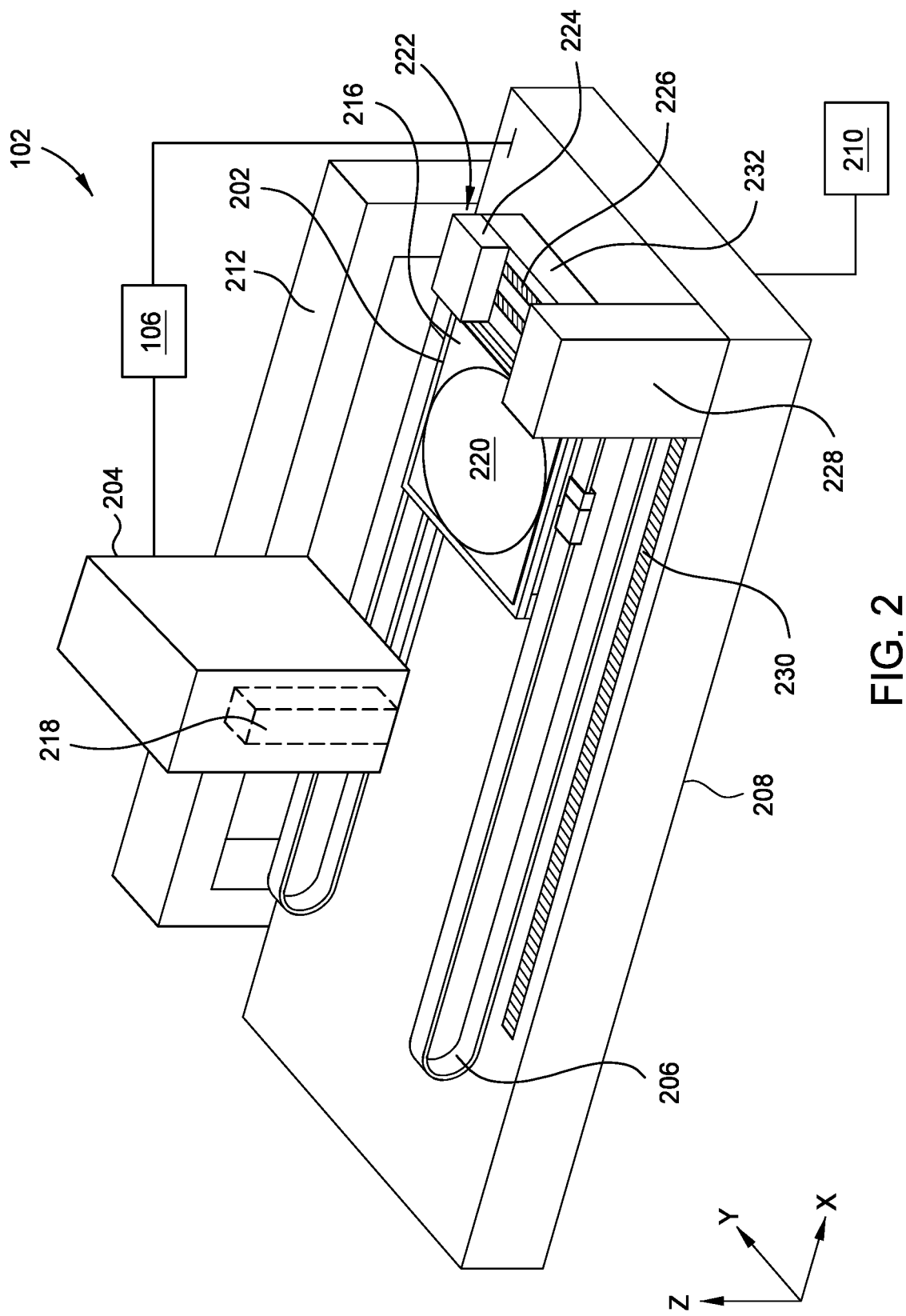
FIG. 2 is a schematic, perspective view of an inkjet chamber according to embodiments.

FIG. 2 is a schematic, perspective view of an inkjet printer 102. The inkjet printer 102 is disposed in a processing region 114 (shown in FIG. 1) of an inkjet chamber 100 (shown in FIG. 1). The inkjet printer 102 includes a stage 202, a processing apparatus 204, and an inkjet service station 222. The stage 202 is supported by a pair of tracks 206 disposed on a slab 208.

A substrate 220 is supported by the stage 202. The inkjet printer 102 is operable to perform an inkjet printing process to print a film. For example, the inkjet printer 102 is operable to perform an inkjet printing process to form an optical film and/or an optical device. In one embodiment, which can be combined with other embodiments described herein, the substrate 220 is an optical device substrate. The substrate 220 is any suitable substrate on which an optical device or optical device film may be formed. The inkjet printing process performed in the inkjet printer 102 assists in the fabrication of at least one optical device or an optical film. It is to be understood that the at least one optical device described herein is an exemplary optical device and other optical devices may be used with or modified to accomplish aspects of the present disclosure. In one embodiment, which can be combined with other embodiments described herein, the optical device is a waveguide combiner. The waveguide combiner may be utilized for virtual, augmented, or mixed reality. In another embodiment, which can be combined with other embodiments described herein, the optical device is a micro-lens array. In another embodiment, which can be combined with other embodiments described herein, the optical device is utilized for prescription glasses. In yet another embodiment, which can be combined with other embodiments described herein, the optical device is a flat optical device, such as a metasurface.

The stage 202 moves along the pair of tracks 206 in at least one of an x direction, a y direction, or a z direction, as indicated by the coordinate system shown in FIG. 2. In one embodiment, the pair of tracks 206 is a pair of parallel magnetic channels. As shown, each track 206 of the pair of tracks 206 is linear. In other embodiments, which can be combined with other embodiments described herein, the pair of tracks 206 may have a non-linear shape. In one embodiment, which can be combined with other embodiments described herein, an encoder is coupled to the stage 202 in order to provide information of the location of the stage 202 to a controller 210. The controller 210 is generally designed to facilitate the control and automation of the inkjet printing process described herein. The controller 210 may be coupled to or in communication with the processing apparatus 204, the stage 202, and the encoder.

The processing apparatus 204 is coupled to a support 212. The processing apparatus 204 is disposed over the pair of tracks 206. The pair of tracks 206 and the stage 202 are operable to pass under the processing apparatus 204. The processing apparatus 204 is supported over the slab 208 by the support 212. The processing apparatus 204 is operable to distribute one or more inkjet materials onto the substrate 220. The substrate 220 is positioned on the stage 202 via a transfer robot (not shown).

The stage 202 may include a chucking device 216 to retain the substrate 220. In one embodiment, which can be combined with other embodiments described herein, the chucking device 216 is elevated from the surface of the stage 202. In another embodiment, the chucking device 216 is a vacuum chuck. The chucking device 216 retains the substrate 220 while minimizing contact to a backside surface of the substrate 220 and contamination of the substrate 220. The chucking device 216 is operable to retain the substrate 220 such that a backside surface of the substrate 220 is facing upwards. Thus, the inkjet printer 102 allows for double-side processing of the substrate 220. The capability of double-side processing allows the inkjet printer 102 to perform the inkjet printing process on both surfaces of the substrate 220, which largely expands the design space and functionality of the substrate.

The processing apparatus 204 is operable to distribute one or more inkjet materials onto the substrate 220. The processing apparatus 204 includes one or more printheads 218 disposed therein. A fluid supply manifold 106 (shown in FIG. 1) may include a plurality of inkjet material sources. Each inkjet material source is fluidly coupled to one of the plurality of printheads 218. The one or more printheads 218 are operable to deposit inkjet materials from the fluid supply manifold 106 to the substrate 220. Although FIG. 2 only shows one printhead 218, the processing apparatus 204 is not limited in the number of printheads 218 in the processing apparatus 204. In one embodiment, which can be combined with other embodiments described herein, the one or more printheads 218 are operable to deposit one or more inkjet materials.

The inkjet service station 222 is disposed on the slab 208. The inkjet service station 222 is operable to provide servicing operations to the inkjet printer 102. The inkjet service station 222 includes a catch tray 224, a first slide rail 230, a second slide rail 226, a service stage 228, and a service stage extension 232. The catch tray 224 is coupled to the service stage 228 via the service stage extension 232. The second slide rail 226 is disposed along the service stage extension 232. The catch tray 224 is disposed on the second slide rail 226. The catch tray 224 is operable to move along the second slide rail 226. The second slide rail 226 provides for the catch tray 224 to move in the y direction. The first slide rail 230 is disposed along the slab 208. The service stage 228 is disposed on the first slide rail 230. The service stage 228 is operable to move along the first slide rail 230. The first slide rail 230 provides for the service stage 228 to move in the x direction (e.g., parallel to tracks 206). Therefore, the inkjet service station 222 is operable to move the catch tray 224 in one or both of the x direction and the y direction. In one embodiment, which can be combined with other embodiments described herein, the service stage 228 is operable to move the service stage extension 232 and the catch tray 224 in the z direction.

The inkjet service station 222 is also fluidly coupled to the fluid supply manifold 106 (shown in FIG. 1). The fluid supply manifold 106 is operable to supply service fluids utilized in the servicing operations. The fluid supply manifold 106 is operable to supply the service fluids to the processing apparatus 204 of the inkjet printer 102.

The catch tray 224 is operable to be positioned below the processing apparatus 204 during servicing operations. Specifically, the catch tray 224 is operable to be positioned below the one or more printheads 218 in the processing apparatus 204. The catch tray 224 is operable to collect liquids deposited from the one or more printheads 218. The catch tray 224 is in a work position when disposed under the processing apparatus 204. The catch tray 224 is in the work position when the catch tray 224 is positioned such that the inkjet service station 222 is operable to perform the servicing operations under the processing apparatus 204. The catch tray 224 is in a park position when not performing servicing operations. The catch tray 224 is in the park positon when the catch tray 224 is not disposed under the processing apparatus 204. The catch tray 224 is in the park positon in FIG. 2.

Figure 3A:
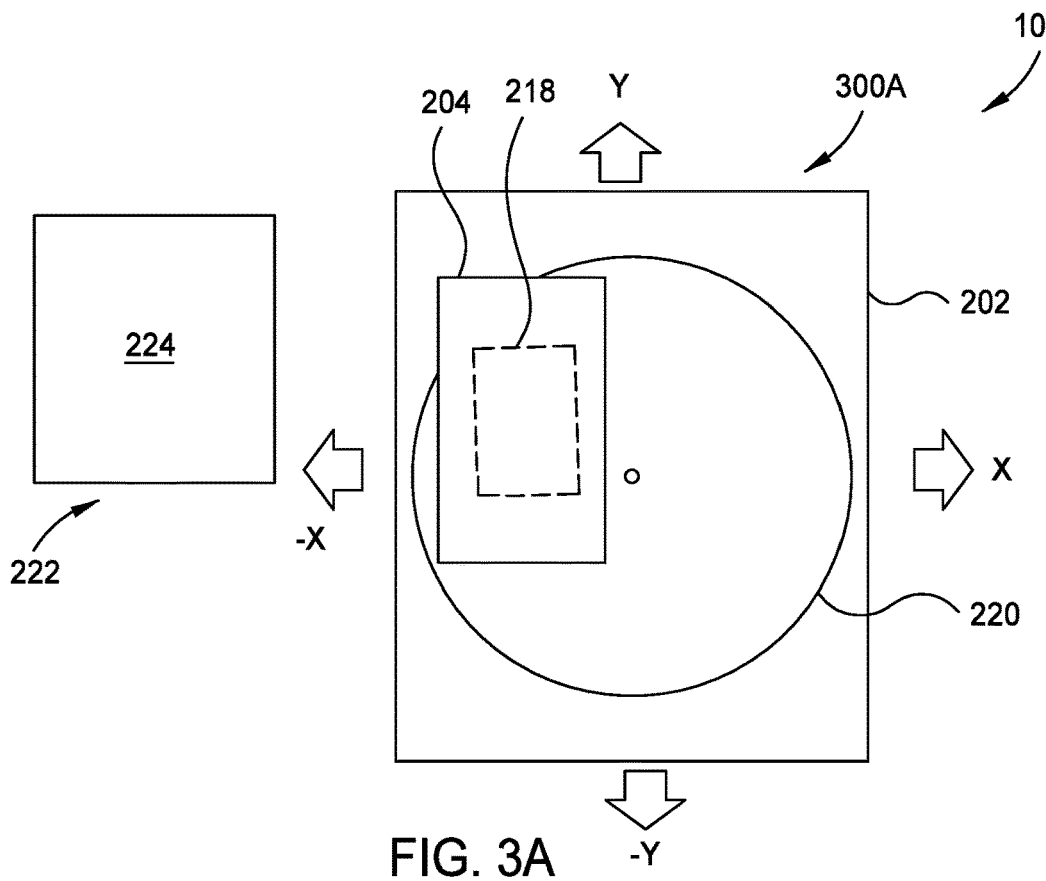
FIG. 3A is a schematic, top view of a first configuration of an inkjet printer according to embodiments.

FIG. 3A is a schematic, top view of a first configuration 300A of an inkjet printer 102. The inkjet printer 102 includes at least a processing apparatus 204, one or more printheads 218, a stage 202, and an inkjet service station 222. The stage 202 may have a substrate 220 disposed thereon. For example, the stage 202 is operable to retain an optical device substrate via vacuum suction.

In the first configuration 300A of the inkjet printer 102, as shown in FIG. 2, the processing apparatus 204 remains stationary during a servicing operation. The inkjet service station 222 is operable to perform the servicing operations on the processing apparatus 204. The servicing operations include at least one of printhead spitting, printhead purging, printhead flushing, printhead cleaning, printhead drying, or vacuum suction. During an inkjet printing process, the stage 202 is operable to move the substrate 220 in at least an −x direction, x direction, −y direction, and y direction. The processing apparatus 204 remains stationary during the inkjet printing process. Upon completion or prior to the inkjet printing process, the inkjet service station 222 is operable to independently move in at least an −x direction, x direction, −y direction, and y direction to move into a work position. Specifically, a catch tray 224 moves in at least an −x direction, x direction, −y direction, and y direction to move into a work position. Maintaining the processing apparatus 204 stationary in both the inkjet printing process and the servicing operations may eliminate movement of the one or more printheads 218, cables disposed in the processing apparatus 204, and inkjet materials. Therefore, process stability, printing consistency, and system robustness are improved.

Figure 3B:
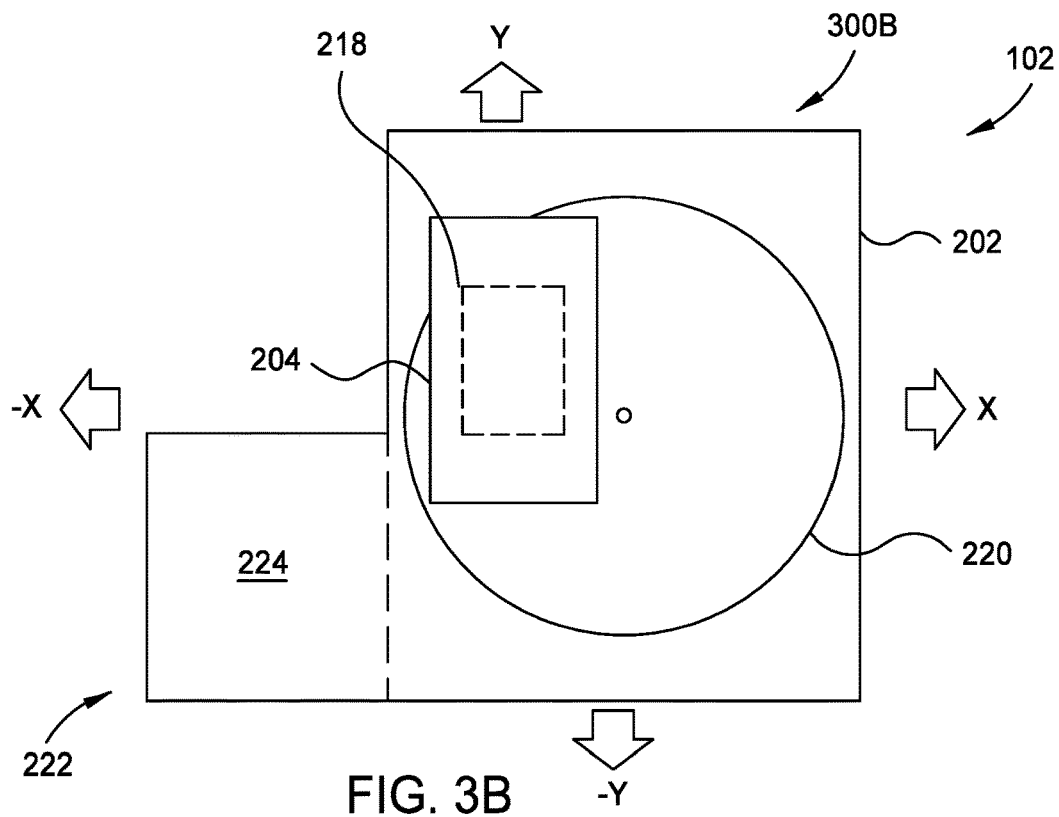
FIG. 3B is a schematic, top view of a second configuration of an inkjet printer according to embodiments.

FIG. 3B is a schematic, top view of a second configuration 300B of an inkjet printer 102. The inkjet printer 102 includes at least a processing apparatus 204, one or more printheads 218, a stage 202, and a service station 222. The stage 202 may have a substrate 220 disposed thereon. For example, the stage 202 is operable to retain an optical device substrate, e.g., via vacuum suction.

In the second configuration 300B of the inkjet printer 102, the processing apparatus 204 remains stationary during a servicing operation. The inkjet service station 222 is operable to perform the servicing operations on the processing apparatus 204. The servicing operations include at least one of printhead spitting, printhead purging, printhead flushing, printhead cleaning, printhead drying, or vacuum suction. During an inkjet printing process, the stage 202 is operable to move the substrate 220 in at least an −x direction, x direction, −y direction, and y direction. The processing apparatus 204 remains stationary during the inkjet printing process. The inkjet service station 222 is coupled to the stage 202. Upon completion or prior to the inkjet printing process, the inkjet service station 222, including a catch tray 224, and the stage 202 move in at least an −x direction, x direction, −y direction, and y direction to move into a work position. Maintaining the processing apparatus 204 stationary in both the inkjet printing process and the servicing operations may eliminate movement of the one or more printheads 218, cables disposed in the processing apparatus 204, and the inkjet material. Therefore, process stability, printing consistency, and system robustness are improved.

Figure 4A:
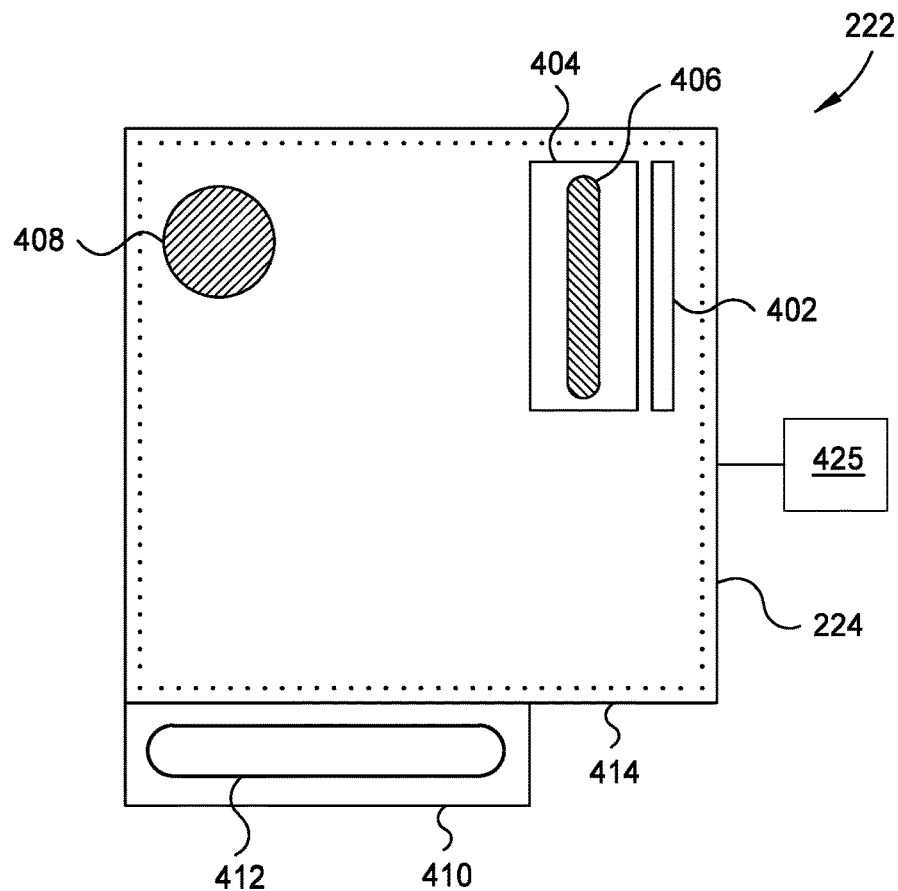
FIG. 4A is a schematic, top view of a catch tray according to embodiments.
Figure 4B:
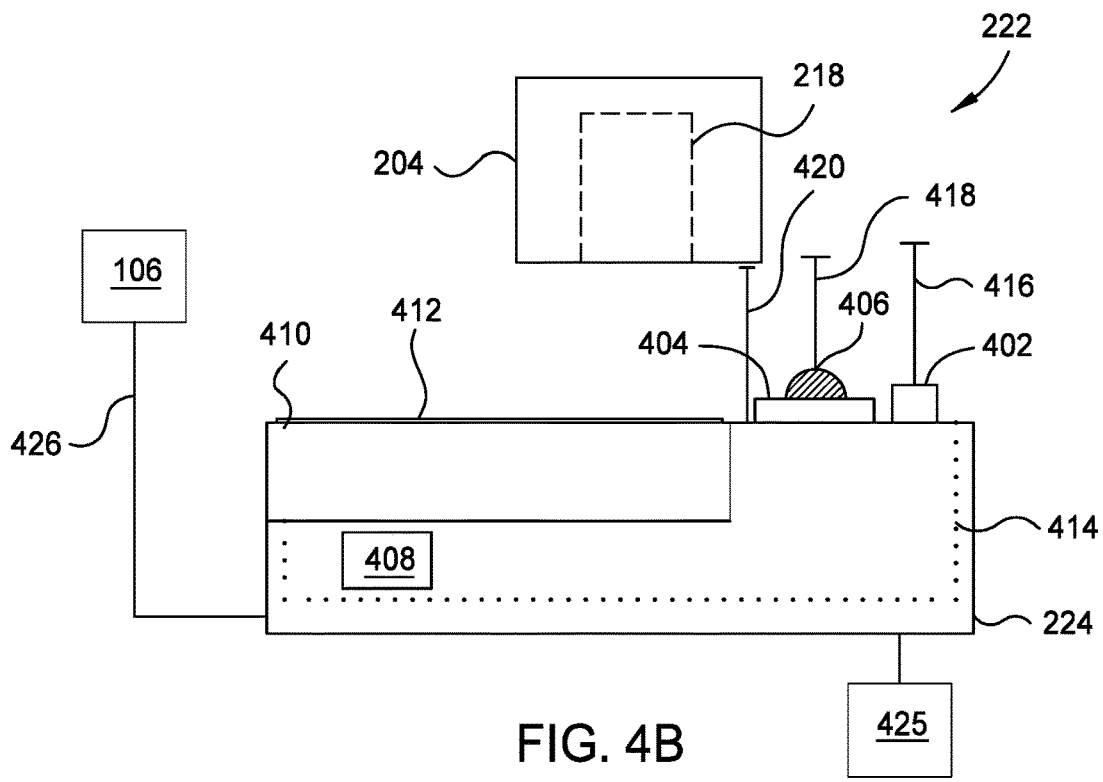
FIG. 4B is a schematic, side view of a catch tray according to embodiments.

FIG. 4A is a schematic, top view of a catch tray 224. FIG. 4B is a schematic, side view of a catch tray 224. The catch tray 224 is included in an inkjet service station 222 (shown in FIG. 2). The catch tray 224 includes a vacuum knife 402, a cleaning head 404, a liquid bubble 406, and a leak sensor 408. The catch tray 224 is operable to be positioned in a work position under a processing apparatus 204 of an inkjet printer 102 (shown in FIG. 2). The catch tray 224 assists in performing servicing operations on the processing apparatus 204 and one or more printheads 218 disposed in the processing apparatus 204.

The catch tray 224 is operable to collect liquids disposed from the one or more printheads 218 (shown in FIG. 2). The cleaning head 404 is disposed in the catch tray 224. The cleaning head 404 supports the liquid bubble 406 thereon. The cleaning head 404 receives service fluids from a fluid supply manifold 106 (shown in FIG. 1) to be utilized in the servicing operations. The catch tray 224 is further operable to collect overflow service fluids ejected from the cleaning head 404. The liquid bubble 406 is a steady state liquid bubble operable to wet and wipe the one or more printheads 218. The vacuum knife 402 is operable to dry the one or more printheads 218 after the liquid bubble 406 passes over the one or more printheads 218.

The leak sensor 408 is disposed at the bottom of the catch tray 224. The leak sensor 408 is operable to detect overflow in the catch tray 224 of service fluids or inkjet materials. The leak sensor 408 may be in communication with a controller 210 (shown in FIG. 2). When the leak sensor 408 detects overflow, the leak sensor 408 will alert the controller 210 and trigger a system interlock. The catch tray 224 may be emptied during the system interlock. In one embodiment, the catch tray 224 includes a drain 425. The service fluids and inkjet materials may be flowed out through the drain 425 for disposal. In another embodiment, the service fluids and inkjet materials may be flowed back to the fluid supply manifold 106 via a recirculation line 426 coupled to the catch tray 224.

In one embodiment, which can be combined with other embodiments described herein, the catch tray 224 further includes a vacuum cap 410. The vacuum cap 410 may be coupled to an outside surface 414 of the catch tray 224. An O-ring 412 is coupled to the vacuum cap 410. In one embodiment, which can be combined with other embodiments described herein, the O-ring 412 is disposed around the circumference of the vacuum cap 410. The vacuum cap 410 and the O-ring 412 are operable to provide vacuum suction. For example, the vacuum cap 410 may seal to one or more nozzles on the one or more printheads 218 to extract inkjet materials from the one or more printheads 218 utilizing vacuum force. The vacuum cap 410 removes residual contaminants, such as inkjet materials, from the one or more printheads 218.

As shown in FIG. 4B, a knife distance 416 is defined as the distance between the vacuum knife 402 and the one or more printheads 218. The knife distance 416 is between about 100 μm and about 300 μm. A cleaning head distance 418 is defined as the distance between the cleaning head 404 and the one or more printheads 218. The cleaning head distance 418 is between about 0.2 mm to about 3 mm. A tray distance 420 is defined as the distance between the catch tray 224 and the one or more printheads 218. The tray distance 420 is between about 1 mm and about 5 mm.

Figure 5:
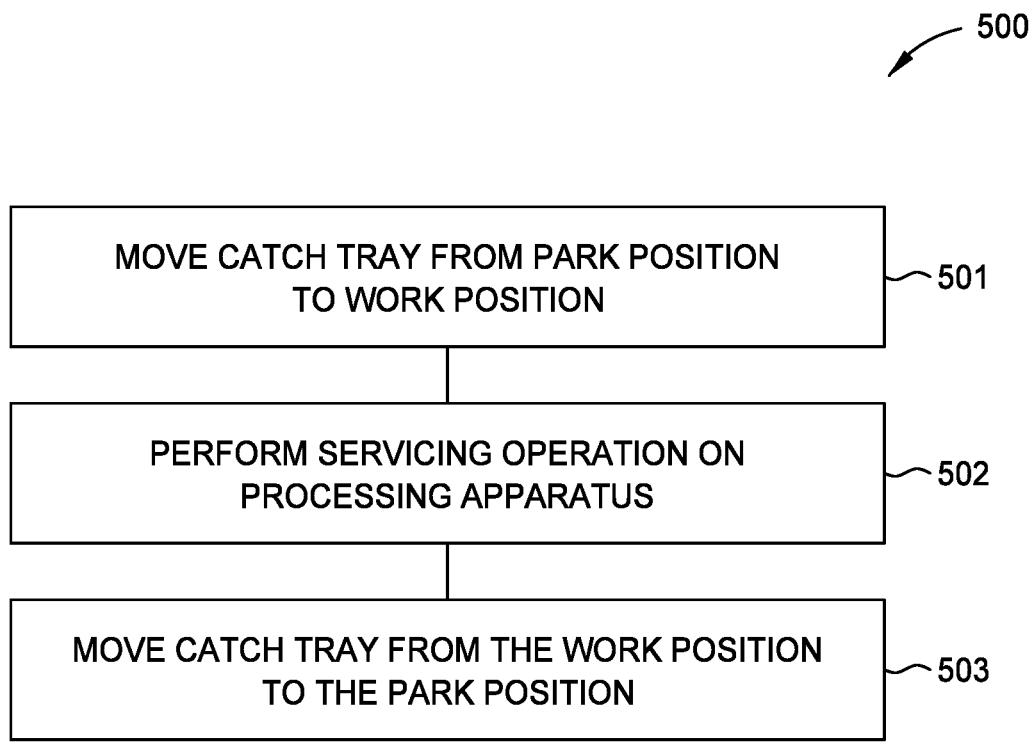
FIG. 5 is a flow diagram of a method for performing service operations with an inkjet service station according to embodiments.

FIG. 5 is a flow diagram of a method 500 for performing service operations with an inkjet service station 222. To facilitate explanation, the method 500 will be described with reference to FIG. 1, FIG. 2, FIG. 3A, and FIGS. 4A and 4B. However, any configuration of the inkjet printer 102 may be used in conjunction with the method 500. For example, the second configuration 300B shown in FIG. 3B may be utilized in conjunction with the method 500. The method 500 is operable to perform the service operations on a processing apparatus 204 of the inkjet printer 102 disposed in an inkjet chamber 100.

At operation 501, a catch tray 224 is moved from a park position to a work position. The catch tray 224 is in the work position when disposed under the processing apparatus 204. The catch tray 224 is in the work position when the catch tray 224 is positioned such that the inkjet service station 222 is operable to perform the servicing operations under the processing apparatus 204. The catch tray 224 is coupled to a service stage 228. The service stage 228 may move in the x direction. The catch tray 224 may move in the y direction. Therefore, the catch tray 224 moves in at least an −x direction, x direction, −y direction, and y direction to move into the work position. The processing apparatus 204 remains stationary. Thus, process stability, printing consistency, and system robustness are improved.

At operation 502, servicing operations are performed on the processing apparatus. The servicing operations are performed by or assisted by the inkjet service station 222 utilizing the catch tray 224. The servicing operations include at least one of printhead spitting, printhead purging, printhead flushing, printhead cleaning, printhead drying, or vacuum suction. Performing the servicing operations in a single inkjet service station 222 will improve performance consistency and optimize lifetime of the inkjet printer 102. The servicing operations will also prevent clogging within the one or more printheads 218, undesired chemical and physical interactions of inkjet materials in the one or more printheads 218, uneven pressure distribution of the inkjet materials, and damage to interior components of the one or more printheads 218. The inkjet service station 222 is not limited in the number of servicing operations that may be performed.

The printhead spitting operation is performed such that the one or more printheads 218 deposit a fixed number of drops of inkjet material during idling of the processing apparatus 204. In one embodiment, which can be combined with other embodiments described herein, the frequency of the deposition action during the printhead spitting operation is the same as the frequency of the deposition during the inkjet printing process. In another embodiment, which can be combined with other embodiments described herein, the frequency of the deposition action during the printhead spitting operation is different than the frequency of the deposition during the inkjet printing process. The printhead spitting operation actively prevents inkjet material settlement and inkjet material clogging. The number of ink drops of inkjet material being deposited per printhead 218 and the deposition duration may be adjusted. The deposition frequency during the printhead spitting operation is between once per minute to about once per hour. The catch tray 224 collects the inkjet material deposited from the one or more printheads 218 during the printhead spitting operation.

The printhead purging operation is performed by introducing positive air pressure through the one or more printheads 218. The positive air pressure pushes the inkjet material out of the one or more printheads 218 to drive away clogging inkjet materials formed along ink delivery channels, manifolds, and cavities. The printhead purging operation may be performed about semi-daily or about daily. The catch tray 224 collects the inkjet material deposited from the one or more printheads 218 during the printhead purging operation.

The printhead flushing operation includes providing a service fluid through the one or more printheads 218 to drive out and replace the inkjet material in the one or more printheads 218. The catch tray 224 collects the inkjet material and the service fluid deposited from the one or more printheads 218 during the printhead flushing operation. The printhead flushing operation utilizes service fluids provided from a fluid supply manifold 106 disposed in the inkjet chamber 100. The printhead flushing operation prevents unstable inkjet materials from residing in the one or more printheads 218 for extended periods of time when the inkjet printing process is not performed. The printhead flushing operation also may purge inkjet material clogs by pressurizing the one or more printheads 218.

The printhead cleaning operation involves the wiping of one or more printheads 218 with a liquid bubble 406 formed from a cleaning head 404 disposed in the catch tray 224. The liquid bubble 406 utilizes service fluids provided from a fluid supply manifold 106 disposed in the inkjet chamber 100. The printhead cleaning operation removes contaminants on the one or more printheads 218 and removes contaminants within a shallow depth into the one or more printheads 218. The catch tray 224 collects the inkjet material and service fluids deposited from the one or more printheads 218 and the liquid bubble 406 during the printhead cleaning operation.

The printhead drying operation removes service fluids or inkjet materials from the one or more printheads 218. A vacuum knife 402 is disposed proximate the one or more printheads 218 to collect the residual service fluids or inkjet materials. The service fluids and inkjet materials are deposited in the catch tray 224 or may be flowed back to the fluid supply manifold 106 via a recirculation line 426 coupled to the catch tray 224.

The vacuum suction operation provides a seal around the one or more printheads 218. A vacuum cap 410 coupled to the catch tray 224 and an O-ring 412 coupled to the vacuum cap 410 may form the seal with the one or more printheads 218. The vacuum cap 410 extracts inkjet materials and other contaminants from the one or more printheads 218. The vacuum suction operation prevents nozzle clogging.

The inkjet materials, service fluids, and other contaminants may be flowed from the catch tray 224 to a drain 425. The drain 425 allows for the inkjet materials, service fluids, and other contaminants to be removed from the catch tray 224. In some embodiments, the inkjet materials and the service fluids may be flowed back to the fluid supply manifold 106 via a recirculation line 426 coupled to the catch tray 224.

At operation 503, the catch tray 224 is moved from the work position to the park position. The catch tray 224 is in a park position when not performing servicing operations. The catch tray 224 is in the park positon as shown in FIG. 2. In the park positon, the catch tray 224 may continue to flow any inkjet materials, service fluids, or other contaminants to the drain 425 or to the recirculation line 426.

In summation, an inkjet service station and methods of servicing an inkjet printer with the inkjet service station are provided herein. The inkjet service station is disposed in an inkjet printer of an inkjet chamber. The inkjet service station is operable to perform servicing operations on a processing apparatus of the inkjet printer. The servicing operations include at least one of printhead spitting, printhead purging, printhead flushing, printhead cleaning, printhead drying, or vacuum suction. The inkjet service station is operable to move a catch tray independently in at least an −x direction, x direction, −y direction, and y direction to move into a work position under the processing apparatus. The processing apparatus remains stationary, thus process stability, printing consistency, and system robustness of the inkjet printer are improved. Performing the servicing operations with a single inkjet service station will improve performance consistency and optimize lifetime of the inkjet printer.

While the foregoing is directed to embodiments of the present disclosure, other and further embodiments of the disclosure may be devised without departing from the basic scope thereof, and the scope thereof is determined by the claims that follow.

What is claimed is:
1. An inkjet service station, comprising:
 a first slide rail;
 a service stage disposed on the first slide rail;
 a service stage extension coupled to the service stage;
 a second slide rail disposed on the service stage extension; and
 a catch tray disposed on the second slide rail, the catch tray comprising:
  a vacuum knife disposed in the catch tray;
  a cleaning head disposed in the catch tray, the cleaning head operable to form a liquid bubble; and
  a leak sensor disposed in the catch tray.
2. The inkjet service station of claim 1, wherein the service stage is operable to move along the first slide rail in an x direction.
3. The inkjet service station of claim 2, wherein the catch tray is operable to move along the second slide rail in a y direction, such that the catch tray is operable to move in one or both of the x direction and the y direction.
4. The inkjet service station of claim 1, wherein the catch tray further comprises:
 a vacuum cap coupled to the catch tray; and
 an O-ring coupled to the vacuum cap.
5. An inkjet chamber, comprising:
 a fluid supply manifold disposed in a lower region of the inkjet chamber;

an inkjet printer disposed in a processing region of the inkjet chamber, the inkjet chamber in fluid communication with the fluid supply manifold, the inkjet printer comprising:
- a moveable stage configured to move along a pair of tracks;
- a processing apparatus disposed above the moveable stage; and
- an inkjet service station, the inkjet service station comprising:
  - a first slide rail;
  - a service stage disposed on the first slide rail;
  - a service stage extension coupled to the service stage;
  - a second slide rail disposed on the service stage extension; and
  - a catch tray disposed on the second slide rail.

6. The inkjet chamber of claim 5, wherein the service stage is operable to move along the first slide rail in an x direction.

7. The inkjet chamber of claim 6, wherein the catch tray is operable to move along the second slide rail in a y direction, such that the catch tray is operable to move in one or both of the x direction and the y direction.

8. The inkjet chamber of claim 5, wherein the processing apparatus further includes one or more printheads, the one or more printheads operable to be serviced by the inkjet service station.

9. The inkjet chamber of claim 8, wherein a tray distance defined as a distance between the catch tray and the one or more printheads is between about 1 mm and about 5 mm.

10. The inkjet chamber of claim 5, wherein the catch tray further comprises:
- a vacuum cap coupled to the catch tray; and
- an O-ring coupled to the vacuum cap.

11. The inkjet chamber of claim 5, wherein the processing apparatus is coupled to a support of the inkjet chamber such that the processing apparatus is stationary.

12. An inkjet chamber, comprising:
- a fluid supply manifold disposed in a lower region of the inkjet chamber;
- an inkjet printer disposed in a processing region of the inkjet chamber, the inkjet chamber in fluid communication with the fluid supply manifold, the inkjet printer comprising:
  - a moveable stage configured to move along a pair of tracks;
  - a processing apparatus disposed above the moveable stage; and
  - an inkjet service station, the inkjet service station comprising:
    - a first slide rail;
    - a service stage disposed on the first slide rail;
    - a service stage extension coupled to the service stage;
    - a second slide rail disposed on the service stage extension; and
    - a catch tray disposed on the second slide rail, wherein the catch tray comprises:
      - a vacuum knife disposed in the catch tray;
      - a cleaning head disposed in the catch tray, the cleaning head operable to form a liquid bubble; and
      - a leak sensor.

13. A method of performing servicing operations, comprising:
- positioning a catch tray of a printhead service station under a processing apparatus of an inkjet printer, the catch tray moving on a second slide rail in one or both of an x direction and a y direction to be positioned under one or more printheads of the processing apparatus such that the processing apparatus remains stationary, the second slide rail disposed on a service stage extension;
- performing one or more of the servicing operations on the processing apparatus with the catch tray, the servicing operations including one or more of printhead spitting, printhead purging, printhead flushing, printhead cleaning, printhead drying, or vacuum suction operations; and
- moving the catch tray in one or both of an x direction and a y direction to be positioned away from the processing apparatus.

14. The method of performing servicing operations of claim 13, wherein the printhead service station moves independently of a moveable stage configured to retain a substrate under the processing apparatus.

15. The method of performing servicing operations of claim 13, wherein the printhead spitting includes depositing drops of inkjet materials at a fixed rate into the catch tray.

16. A method of performing servicing operations, comprising:
- positioning a catch tray of a printhead service station under a processing apparatus of an inkjet printer, the catch tray moving in one or both of an x direction and a y direction to be positioned under one or more printheads of the processing apparatus such that the processing apparatus remains stationary;
- performing one or more of the servicing operations on the processing apparatus with the catch tray, the servicing operations including one or more of printhead spitting, printhead purging, printhead flushing, printhead cleaning, printhead drying, or vacuum suction operations, wherein the printhead purging includes providing a positive air pressure through the one or more printheads such that inkjet materials in the one or more printheads are deposited into the catch tray; and
- moving the catch tray in one or both of an x direction and a y direction to be positioned away from the processing apparatus.

17. The method of performing servicing operations of claim 13, wherein the printhead flushing includes providing a servicing fluid through the one or more printheads such that inkjet materials and the servicing fluids are deposited into the catch tray.

18. A method of performing servicing operations, comprising:
- positioning a catch tray of a printhead service station under a processing apparatus of an inkjet printer, the catch tray moving in one or both of an x direction and a y direction to be positioned under one or more printheads of the processing apparatus such that the processing apparatus remains stationary;
- performing one or more of the servicing operations on the processing apparatus with the catch tray, the servicing operations including one or more of printhead spitting, printhead purging, printhead flushing, printhead cleaning, printhead drying, or vacuum suction operations, wherein the printhead cleaning includes wiping one or more printheads with a liquid bubble formed from a cleaning head disposed in the catch tray; and moving the catch tray in one or both of an x direction and a y direction to be positioned away from the processing apparatus.

19. A method of performing servicing operations, comprising:

positioning a catch tray of a printhead service station under a processing apparatus of an inkjet printer, the catch tray moving in one or both of an x direction and a y direction to be positioned under one or more printheads of the processing apparatus such that the processing apparatus remains stationary;

performing one or more of the servicing operations on the processing apparatus with the catch tray, the servicing operations including one or more of printhead spitting, printhead purging, printhead flushing, printhead cleaning, printhead drying, or vacuum suction operations, wherein the printhead drying includes removing service fluids or inkjet materials from the one or more printheads with a vacuum knife disposed in the catch tray; and moving the catch tray in one or both of an x direction and a y direction to be positioned away from the processing apparatus.

20. The method of performing servicing operations of claim 13, wherein the vacuum suction provides a seal around the one or more printheads, a vacuum cap coupled to the catch tray and an O-ring coupled to the vacuum cap form the seal with the one or more printheads such that the vacuum cap extracts inkjet materials from the one or more printheads.

* * * * *